(12) United States Patent
Huang

(10) Patent No.: US 10,424,694 B2
(45) Date of Patent: *Sep. 24, 2019

(54) LIGHT EMITTING DEVICE PACKAGE

(71) Applicant: CHANG WAH TECHNOLOGY CO., LTD., Kaohsiung (TW)

(72) Inventor: Chia-Neng Huang, Kaohsiung (TW)

(73) Assignee: CHANG WAH TECHNOLOGY CO., LTD., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/977,252

(22) Filed: May 11, 2018

(65) Prior Publication Data

US 2019/0181305 A1    Jun. 13, 2019

(30) Foreign Application Priority Data

Dec. 11, 2017  (TW) .............................. 106218341 U

(51) Int. Cl.
| | |
|---|---|
| *H01L 33/48* | (2010.01) |
| *H01L 33/00* | (2010.01) |
| *H01L 33/60* | (2010.01) |
| *H01L 33/62* | (2010.01) |
| *H01L 23/498* | (2006.01) |
| *H01L 33/54* | (2010.01) |

(52) U.S. Cl.
CPC ........ *H01L 33/486* (2013.01); *H01L 33/0033* (2013.01); *H01L 33/60* (2013.01); *H01L 33/62* (2013.01); *H01L 23/49861* (2013.01); *H01L 33/54* (2013.01); *H01L 2224/48091* (2013.01); *H01L 2224/48247* (2013.01); *H01L 2224/48257* (2013.01); *H01L 2224/97* (2013.01); *H01L 2933/0033* (2013.01); *H01L 2933/0066* (2013.01)

(58) Field of Classification Search
CPC ........ H01L 33/486; H01L 33/60; H01L 33/62
See application file for complete search history.

(56) References Cited

U.S. PATENT DOCUMENTS

2017/0229625 A1*  8/2017  Hsieh ..................... H01L 33/60

\* cited by examiner

*Primary Examiner* — Anthony Ho
(74) *Attorney, Agent, or Firm* — Burris Law, PLLC

(57) ABSTRACT

A light emitting device package includes a leadframe unit, a molding layer, and a light emitting device. The leadframe unit has opposite leadframe top and bottom surfaces. The molding layer encloses the leadframe unit, and has a molding-layer bottom surface, a molding-layer surrounding surface extending upward from the molding-layer bottom surface to surround the leadframe unit, and a plurality of solder grooves indented from the molding-layer bottom surface. Each of the solder grooves has one end meeting the leadframe unit and another end opening at the molding-layer surrounding surface. The light emitting device is disposed on the leadframe top surface of the leadframe unit.

12 Claims, 10 Drawing Sheets

US 10,424,694 B2

LIGHT EMITTING DEVICE PACKAGE

CROSS-REFERENCE TO RELATED APPLICATION

This application claims priority of Taiwanese Utility Model Patent Application No. 106218341, filed on Dec. 11, 2017.

FIELD

The disclosure relates to a light emitting device package, and more particularly to a light emitting device package having a plurality of solder grooves.

BACKGROUND

Light emitting diode has advantages of relatively small volume size, great power efficiency, long service life, low power consumption, and short warm-up time, etc., and thus has been used to replace conventional light source(such as an incandescent light bulb) and is widely applied in electroluminescence field. However, there is still a room for improving the reliability of a light emitting device package.

For the purpose of increasing the packaging density and decreasing the packaging size of a light emitting device, a conventional semiconductor device package with a quad flat no-lead (QFN) lead frame is provided with solder joints on a bottom surface of the QFN lead frame. However, when the solder joints of the conventional semiconductor device packages are intended for electrically connecting outwardly to external components, quality of the solder joints and completeness of electrical connection between the solder joints and the external components cannot be inspected simply by visual inspection.

SUMMARY

Therefore, an object of the disclosure is to provide a light emitting device package that can alleviate at least one of the drawbacks of the prior art.

According to the disclosure, the light emitting device package includes a leadframe unit, a molding layer, and a light emitting device.

The leadframe unit has a leadframe top surface, and a leadframe bottom surface opposite to the top surface.

The molding layer encloses the leadframe unit such that the leadframe top surface and the leadframe bottom surface are exposed from the molding layer. The molding layer has a molding-layer bottom surface coplanar with and not covering the leadframe bottom surface, a molding-layer surrounding surface extending upward from the molding-layer bottom surface to surround the leadframe unit, and a plurality of solder grooves. Each of the solder grooves is indented from the molding-layer bottom surface and is disposed between the leadframe unit and the molding-layer surrounding surface, and each of the solder grooves has one end meeting the leadframe unit and another end opening at the molding-layer surrounding surface. The leadframe unit is unexposed from the molding-layer surrounding surface.

The light emitting device is disposed on the leadframe top surface of the leadframe unit.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
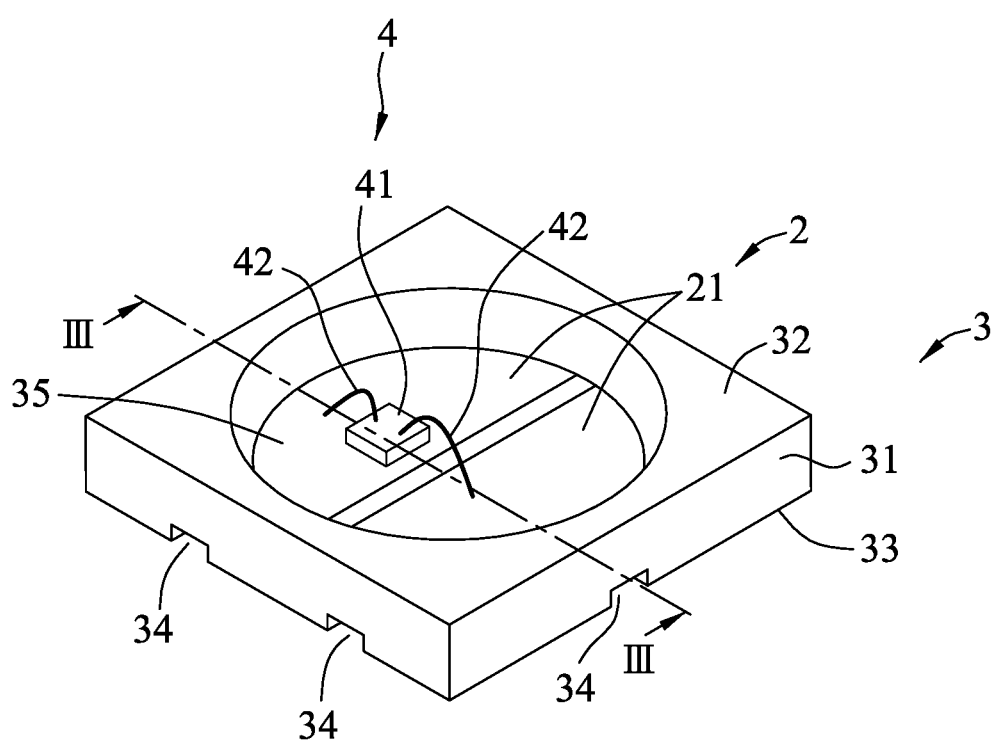
FIG. 1 is a top perspective view illustrating a first embodiment of a light emitting device package according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
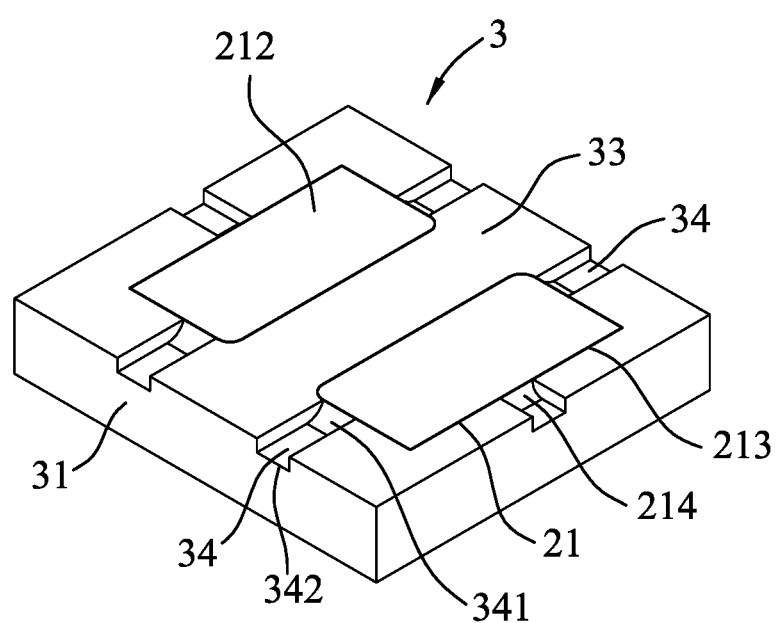
FIG. 2 is a bottom perspective view illustrating the first embodiment.
Figure 3:
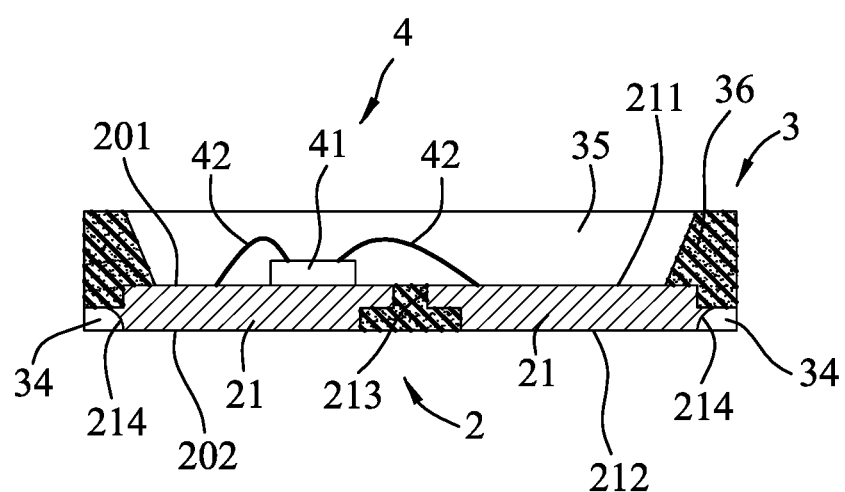
FIG. 3 is a cross-sectional schematic view taken along line III-III of FIG. 1.

Referring to FIGS. 1 to 3, a first embodiment of a light emitting device package according to the disclosure includes a leadframe unit 2, a molding layer 3, and a light emitting device 4.

The leadframe unit 2 is made of a metallic material that is selected from the group consisting of copper, a copper-based alloy, an iron-nickel alloy, and combinations thereof. The leadframe unit 2 has a leadframe top surface 201 adapted to support the light emitting device 4, and a leadframe bottom surface 202 opposite to the leadframe top surface 201.

More specifically, the leadframe unit 2 includes at least two contact electrodes 21 that are spaced apart from each other. The contact electrodes 21 respectively have top ends 211 constituting the leadframe top surface 201 and bottom ends 212 constituting the leadframe bottom surface 202. Each of the contact electrodes 21 has an electrode surrounding surface 213 connected transversely between the leadframe top surface 201 and the leadframe bottom surface 202. In this embodiment, the light emitting device 4 supported on the leadframe top surface 201 is disposed on the top end 211 of at least one of the contact electrodes 21. It is noted that a number of the contact electrodes 21 may be more than two and may be determined based on a required number of the light emitting device 4. In this embodiment, the leadframe unit 2 includes two of the contact electrodes 21.

The molding layer 3 has a portion 36 disposed on the leadframe top surface 201 and partially not covering the top end 211 of each of the contact electrodes 21 to form a mounting area 35 that is exposed from the molding layer 3.

The molding layer 3 encloses the leadframe unit 2 such that the leadframe top surface 201 and the leadframe bottom surface 202 are exposed from the molding layer 3. For example, the molding layer 3 is directly molded over the leadframe unit 2. The molding layer 3 has a molding-layer bottom surface 33 coplanar with and not covering the leadframe bottom surface 202, a molding-layer surrounding surface 31 extending upward from the molding-layer bottom surface 33 to surround the leadframe unit 2, a molding-layer top surface 32 opposite to the molding-layer bottom surface 33, and a plurality of solder grooves 34, which are known as solder seen terminals (SSTs). Each of the solder grooves 34 is indented from the molding-layer bottom surface 33 and is disposed between the leadframe unit 2 and the molding-layer surrounding surface 31. Each of the solder grooves 34 has a first end 341 meeting the leadframe unit 2 and a second end 342 opening at the molding-layer surrounding surface 31. The leadframe unit 2 is unexposed from the molding-layer surrounding surface 31. In this embodiment, the molding layer 3 is filled in between the contact electrodes 21 and extends around the electrode surrounding surfaces 213 of the contact electrodes 21. Each of the contact electrodes 21 meets at least one of the solder grooves 34 at the first end 341 thereof. The electrode surrounding surface 213 of each of the contact electrodes 21 may have an exposed surface portion 214 that is exposed from the molding layer 3 within a respective one of the solder grooves 34. In this embodiment, the exposed surface portion 214 of each of the contact electrodes 21 is concaved in an inward direction relative to the molding-layer surrounding surface 31. Alternatively, the exposed surface portion 214 of each of the contact electrodes 21 may be inclined. The concaved or inclined configuration of the exposed surface portion 214 of each of the contact electrodes 21 contributes to directing flow of a liquid or colloid material, such as a conductive adhesive or solder, applied to the bottom ends 212 of the contact electrodes 21.

The light emitting device 4 includes at least one light emitting member 41 that may be a light emitting diode or a laser diode, etc. In the embodiment, the light emitting member 41 is disposed in the mounting area 35 on the top end 201 of one of the contact electrodes 21 of the leadframe unit 2, and is electrically connected to the other one of the contact electrodes 21 through a wire 42.

As illustrated in FIG. 1 and mentioned above, even though the leadframe unit 2 is unexposed from the molding-layer surrounding surface 31, the solder (not shown) disposed in the solder grooves 34 and connected to the leadframe unit 2 can be visually inspected via the solder grooves 34.

In one form, the molding layer 3 is light reflective at least at the top ends 211 of the contact electrodes 21. Hence, multiple reflections of light emitted from the light emitting member 41 can be generated by the portion of the molding layer 3 that is disposed on the leadframe top surface 201 and partially uncovers the top end 211 of each of the contact electrodes 21, and thus light extraction efficiency of the light-emitting member 41 can be enhanced.

A method of making the first embodiment of the light emitting device package is illustrated as below.

Figure 4A:
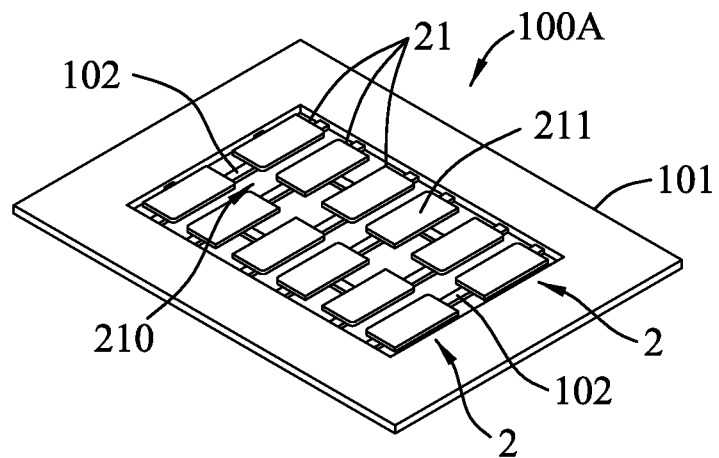
FIGS. 4A to 4E are perspective views illustrating consecutive steps of a method of making the first embodiment of the light emitting device package.
Figure 4B:
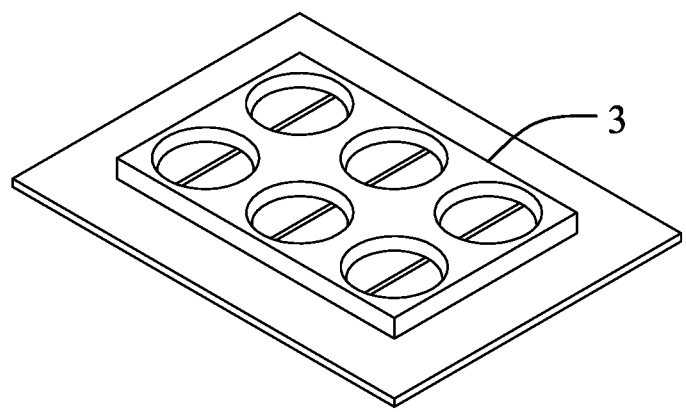
Figure 4C:
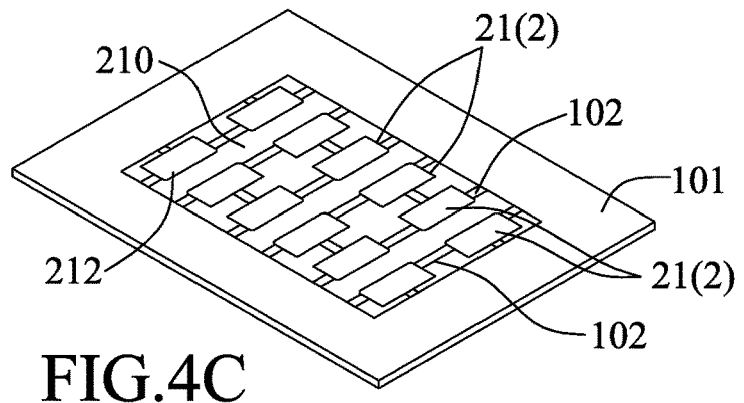

First, referring to FIGS. 4A to 4C, an electrically conductive substrate, which may be made of a material selected from the group consisting of copper, a copper-based alloy, an iron-nickel alloy, and combinations thereof, is etched to form a leadframe semi-product 100A.

The leadframe semi-product 100A includes a framing portion 101, a plurality of spaced-apart connecting portions 102, and a plurality of the leadframe units 2 which are surrounded by the framing portion 101 and each of which includes the two spaced-apart contact electrodes 21. The contact electrodes 21 are arranged in an array, and each of the contact electrodes 21 has the top end 211 and the bottom end 212. A number of the connecting portions 102 are disposed and connected between two adjacent ones of the contact electrodes 21 of different leadframe units 2, and a remaining of the connecting portions 102 are disposed and connected between the contact electrodes 21 and the framing portion 101. In other words, for each of the contact electrodes 21 of each of the leadframe units 2, there is at least one connecting portion 102 connected between the contact electrode 21 and one of the contact electrodes 21 of an adjacent one of the leadframe units 2, and there is at least one connecting portion 102 connected between the contact electrode 21 and the framing portion 101. Hence, the framing portion 101, the contact electrodes 21 and the connecting portions 102 of the leadframe semi-product 100A are integrally formed.

Thereafter, the leadframe semi-product 100A is disposed in a mold (not shown), and then an encapsulating polymeric material, which may be made from epoxy or silicon resin, is filled in a gap 210 among the contact electrodes 21 and the framing portion 101, and covers the connecting portions 102 and a part of the top ends 211 of the contact electrodes 21, followed by curing of the encapsulating polymeric material to form the molding layer 3. FIGS. 4B and 4C are respectively top and bottom views of the leadframe semi-product 100A formed with the molding layer 3.

Figure 4D:
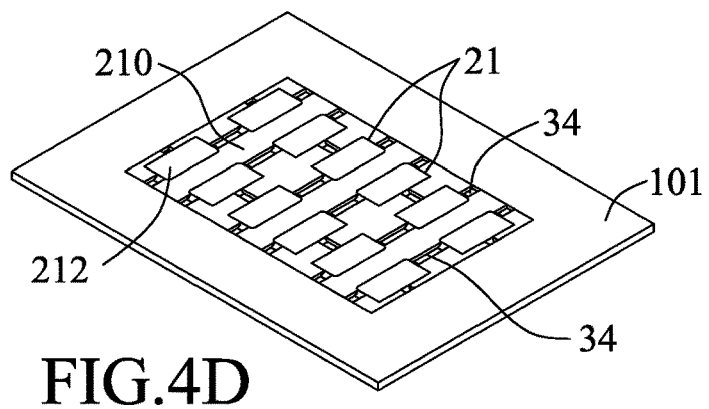
Figure 4E:
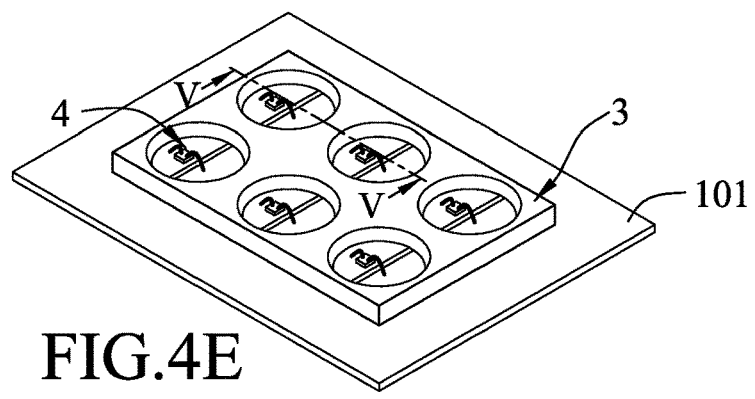

The connecting portions 102 are then etched off so as to form the solder grooves 34 that are indented from the molding-layer bottom surface 33 (as shown in FIG. 4D). The contact electrodes 21 are spaced apart from one another.

Thereafter, for each of the leadframe units 2, the light emitting member 41 of the light emitting device 4 is disposed on one of the contact electrodes 21, and then the wire 42 is connected between the light emitting member 41 and the other one of the contact electrodes 21.

Figure 5:
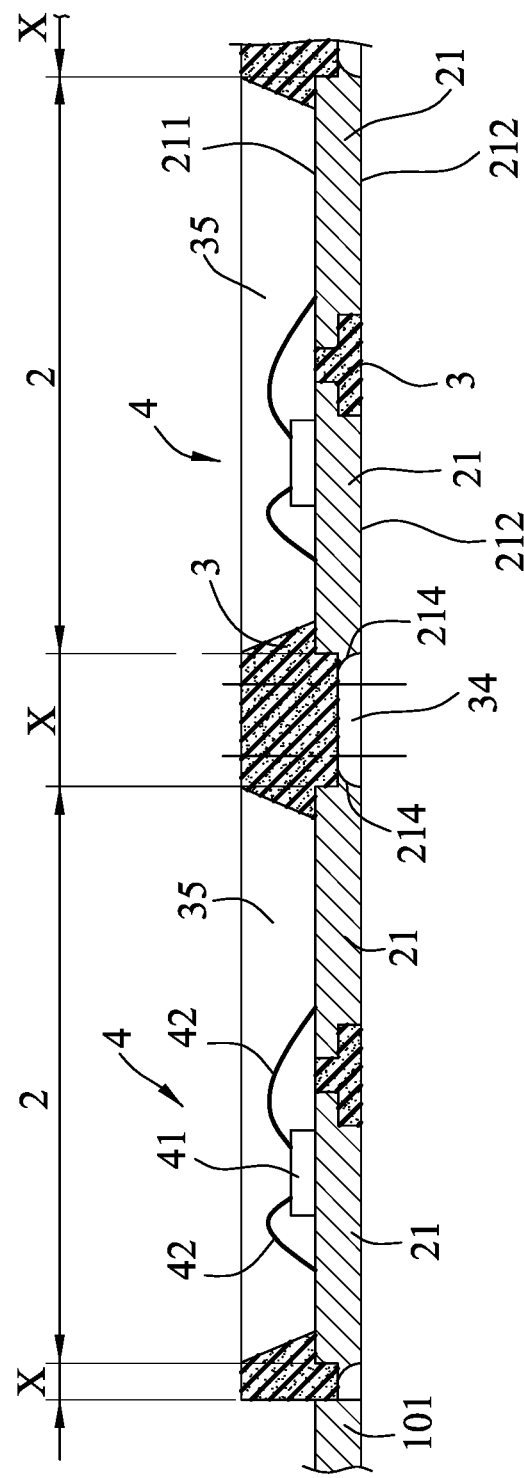
FIG. 5 is a cross-sectional schematic view taken along line V-V of FIG. 4E.

Further referring to FIG. 5, a plurality of the light emitting device packages (two are shown) are singularized by dicing along a scribe line (not shown) defined in a dicing region (X) formed in the molding layer 3.

Alternatively, the molding layer 3 may include a lower portion and an upper portion, and may be formed by sequentially forming the lower portion and the upper portion using different molds. The lower portion extends around the electrode surrounding surfaces 213 of the contact electrodes 21, and has the molding-layer bottom surface 33 coplanar with the bottom ends 212 of the contact electrodes 21 and the molding-layer top surface 32 coplanar with the top ends 211 of the contact electrodes 21. The upper portion formed on the lower portion partially covers the top ends 211 of the contact electrodes 21. When the lower and upper portions are not formed at the same time, the lower and upper portions may be optionally made from identical or different encapsulating polymeric materials. Light reflecting particles may be optionally included in the polymeric encapsulating materials for forming the top portion of the molding layer 3, so that the molding layer 3 is light reflective. Therefore, light extraction efficiency of the light emitting member 41 can be enhanced. Since the mold(s) and the light reflecting particles per se are not the essential features of the disclosure, and are well known to those skilled in the art, further details thereof are not provided herein for the sake of brevity.

Figure 6:
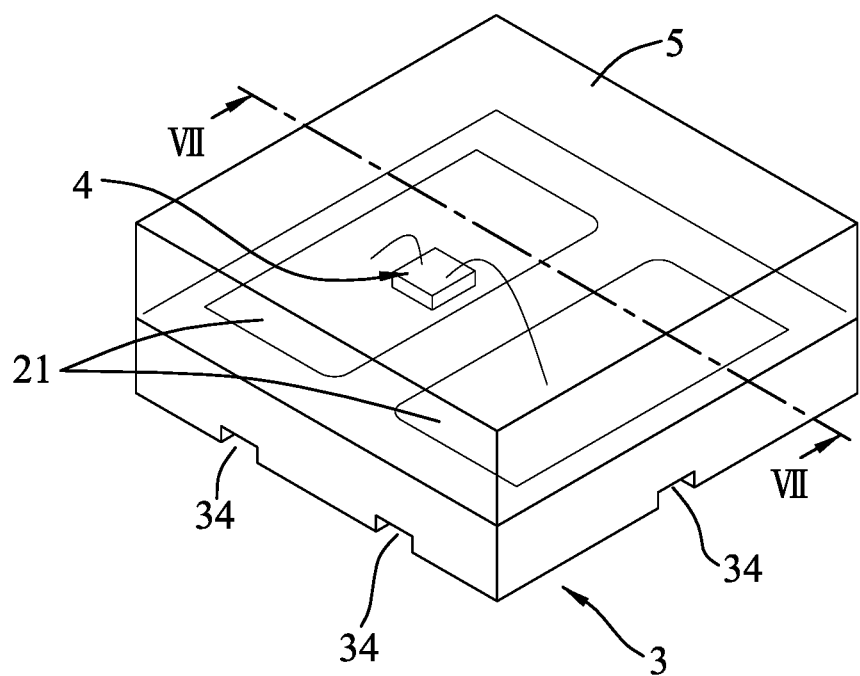
FIG. 6 is a top perspective view illustrating a second embodiment of a light emitting device package according to the disclosure.
Figure 7:
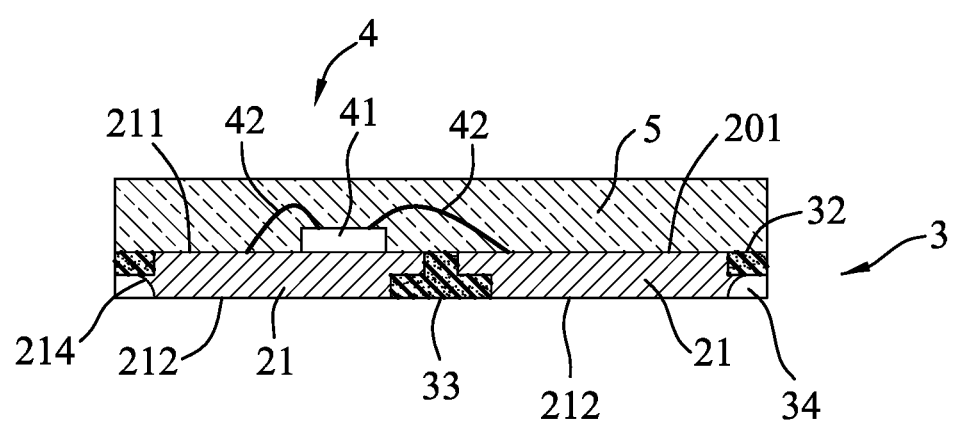
FIG. 7 a cross-sectional schematic view taken along line VII-VII of FIG. 6.

Referring to FIGS. 6 and 7, the second embodiment of the light emitting device package according to the disclosure is illustrated. The light emitting device package has a structure similar to that of the first embodiment and the molding-layer top surface 32 is coplanar with the leadframe top surface 201. The light emitting device package further includes an encapsulant layer 5 encapsulating the molding-layer top surface 32, the leadframe top surface 201 of the leadframe unit 2 and the light emitting device 4.

More specifically, since the molding-layer top surface 32 is coplanar with the top ends 211 of the contact electrodes 21, and since the molding-layer bottom surface 33 is coplanar with the bottom ends 212 of the contact electrodes 21, the leadframe unit 2 cooperatively with the molding layer 3 is plate-shaped. The light emitting member 4 is disposed on the top end 211 of one of the contact electrodes 21 and is electrically connected to the other one of the contact electrodes 21 through the wire 42. The encapsulant layer 5 may be made from an encapsulating material selected from silicon or epoxy resin, etc. The encapsulant layer 5 may include a fluorescent material. The encapsulating material is well known to those skilled in the art and is not provided herein for the sake of brevity.

A method of making the second embodiment of the light emitting device package is similar to that of the first embodiment of the light emitting device package, and the molding-layer top surface 32 of the molding layer 3 is formed to be coplanar with the leadframe top surface 201 of the leadframe unit 2. Furthermore, after disposing a plurality of the light emitting devices 4 and forming a plurality of the wires 42 and before singularizing a plurality of the light emitting device packages, the encapsulant layer 5 is formed to encapsulate the molding-layer top surface 32, the leadframe top surfaces 201 of the leadframe units 2 and the light emitting devices 4.

Similarly, with the solder grooves 34, quality of soldering and completeness of electrical connection between solder joints formed by soldering and the external components can be inspected visually.

It is noted that the first and second embodiments may further include a film-plating process conducted after the formation of the molding layer 3. For the leadframe unit 2 of each of the singularized light emitting device packages, at least one electro-plating layer made from a material that is different from that of the leadframe unit 2 may be formed on at least one of the leadframe bottom surface 202, the leadframe top surface 201, or the exposed surface portion 214. The electro-plating layer may be made from metal or an alloy. To be specific, the electro-plating layer may be made from the material selected from the group consisting of nickel, palladium, silver, gold, and combinations thereof, and may be a single layer or a multi-layered structure. With the electro-plating layer, adhesion of the leadframe unit 2 to the wire 42 and the reliability of light emitting device package can be enhanced after the soldering process.

Figure 8:
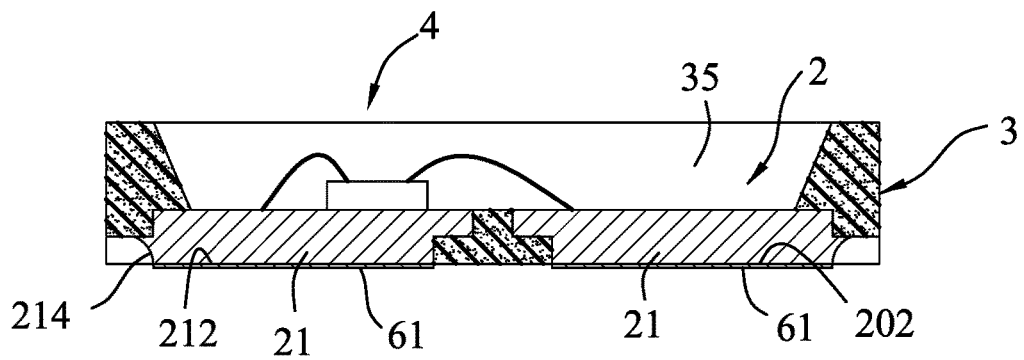
FIG. 8 is a cross-sectional schematic view illustrating the first embodiment further including a bottom electro-plating layer.

Referring to FIG. 8, in one form, the first embodiment of the light emitting device package further includes a bottom electro-plating layer 61 that is disposed on the leadframe bottom surface 202 of the leadframe unit 2 and that may be made from a material different from that of the leadframe unit 2.

Figure 9:
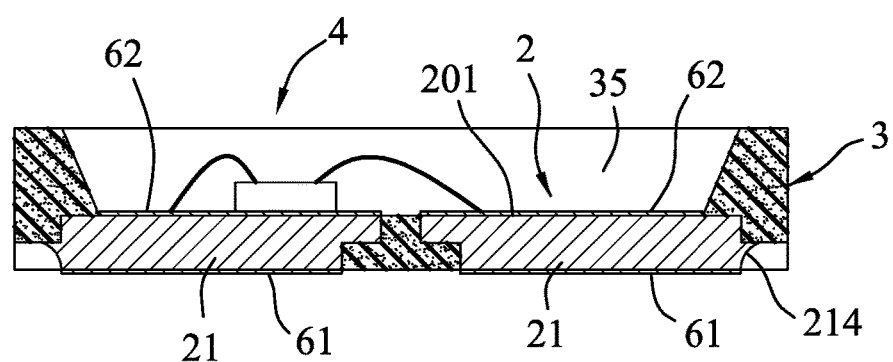
FIG. 9 is a cross-sectional schematic view illustrating the first embodiment of FIG. 8 further including a top electro-plating layer.

Referring to FIG. 9, the first embodiment of the light emitting device package may further include a top electro-plating layer 62 disposed on a part the leadframe top surface 201 of the leadframe unit 2 shown in FIG. 8 which is not covered by the molding layer 3.

Figure 10:
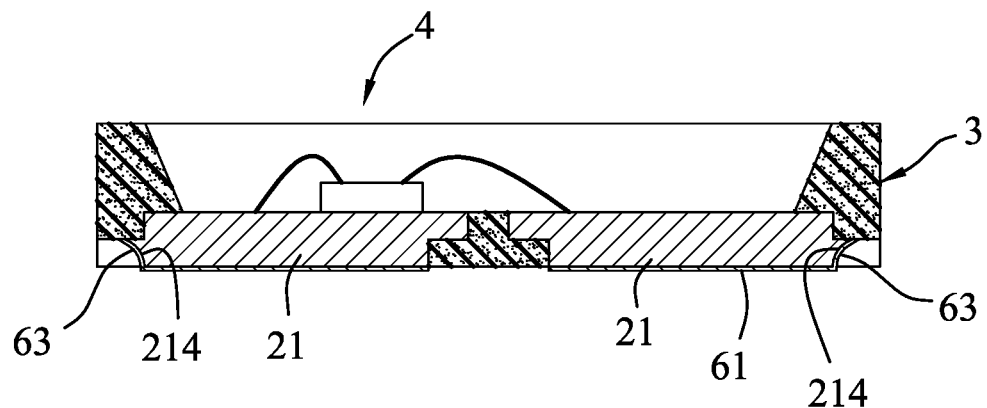
FIG. 10 is a cross-sectional schematic view illustrating the first embodiment of FIG. 8 further including a groove electro-plating layer.

Referring to FIG. 10, the first embodiment of the light emitting device package as shown in FIG. 8 further includes a groove electro-plating layer 63 that is disposed on the exposed surface portions 214 of the electrode surrounding surfaces 213 of the contact electrodes 21 and that may be made from a material different from that of the leadframe unit 2.

Figure 11:
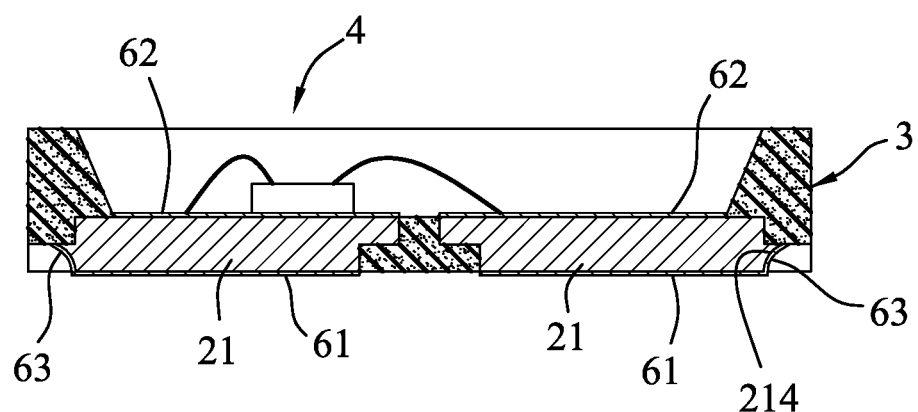
FIG. 11 is a cross-sectional schematic view illustrating the first embodiment of FIG. 9 further including a groove electro-plating layer.

Alternatively, referring to FIG. 11, the groove electro-plating layer 63 may be disposed on the exposed surface portions 214 of the electrode surrounding surfaces 213 of the contact electrodes 21 as shown in FIG. 9.

To sum up, by virtue of the inclusion of the solder grooves 34 in the light emitting device package of this disclosure, quality of soldering and completeness of electrical connection between solder joints formed by soldering and the external components can be inspected visually.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light emitting device package, comprising:
   a leadframe unit having a leadframe top surface, and a leadframe bottom surface opposite to said leadframe top surface;
   a molding layer enclosing said leadframe unit such that said leadframe top surface and said leadframe bottom surface are exposed from said molding layer, said molding layer having a molding-layer bottom surface coplanar with and not covering said leadframe bottom surface, a molding-layer surrounding surface extending upward from said molding-layer bottom surface to surround said leadframe unit, and a plurality of solder grooves, each of which is indented from said molding-layer bottom surface and is disposed between said leadframe unit and said molding-layer surrounding surface, each of said solder grooves having a first end meeting said leadframe unit and a second end opening at said molding-layer surrounding surface, said leadframe unit being unexposed from said molding-layer surrounding surface; and
   a light emitting device disposed on said leadframe top surface of said leadframe unit.

2. The light emitting device package of claim 1, wherein said leadframe unit includes at least two contact electrodes that are spaced apart from each other, said contact electrodes respectively having top ends constituting said leadframe top surface and bottom ends constituting said leadframe bottom surface, each of said contact electrodes having an electrode surrounding surface that is connected transversely between said leadframe top and bottom surfaces, said molding layer being filled in between said contact electrodes and extending around said electrode surrounding surfaces of said contact electrodes, each of said contact electrodes meeting at least one of said solder grooves.

3. The light emitting device package of claim 2, wherein said molding layer has a portion disposed on said leadframe top surface and partially not covering said top end of each of said contact electrodes to form a mounting area that is exposed from said molding layer, said light emitting device being disposed in said mounting area.

4. The light emitting device package of claim 3, wherein said molding layer is light reflective at least at said top ends of said contact electrodes.

5. The light emitting device package of claim 2, wherein said molding layer has a molding-layer top surface that is opposite to said molding-layer bottom surface and coplanar with said leadframe top surface of said leadframe unit, said light emitting device package further comprising an encapsulant layer encapsulating said molding-layer top surface, said leadframe top surface of said leadframe unit and said light emitting device.

6. The light emitting device package of claim 1, further comprising a bottom electro-plating layer that is disposed on said leadframe bottom surface of said leadframe unit and that is made from a material different from that of said leadframe unit.

7. The light emitting device package of claim 1, further including a top electro-plating layer that is disposed on an area of said leadframe top surface of said leadframe unit where said leadframe top surface is not covered by said molding layer, said top electro-plating layer being made from a material different from that of said leadframe unit.

8. The light emitting device package of claim 2, wherein said electrode surrounding surface of each of said contact electrodes has an exposed surface portion that is exposed from said molding layer within a respective one of said solder grooves.

9. The light emitting device package of claim 8, wherein said exposed surface portion is concaved in an inward direction relative to said molding-layer surrounding surface.

10. The light emitting device package of claim 8, wherein said light emitting device package further includes a groove electro-plating layer that is disposed on said exposed surface portion 214 of said electrode surrounding surface 213 and that is made from a material different from that of said leadframe unit.

11. The light emitting device package of claim 1, wherein said leadframe unit is made of a metallic material selected from the group consisting of copper, a copper-based alloy, an iron-nickel alloy, and combinations thereof.

12. The preformed leadframe device of claim 1, wherein said molding layer is directly molded over said leadframe unit.

\* \* \* \* \*